(12) United States Patent
Fujieda et al.

(10) Patent No.: US 6,894,432 B2
(45) Date of Patent: May 17, 2005

(54) LIGHT EMITTING DEVICE AND PRODUCTION METHOD THEREOF

(75) Inventors: Ichiro Fujieda, Tokyo (JP); Takashi Fukuchi, Tokyo (JP); Shinzo Tsuboi, Tokyo (JP)

(73) Assignee: NEC Corporation, Tokyo (JP)

(*) Notice: Subject to any disclaimer, the term of this patent is extended or adjusted under 35 U.S.C. 154(b) by 192 days.

(21) Appl. No.: 10/023,082

(22) Filed: Dec. 17, 2001

(65) Prior Publication Data

US 2002/0084747 A1 Jul. 4, 2002

(30) Foreign Application Priority Data

Dec. 28, 2000 (JP) ........................................ 2000-401400

(51) Int. Cl.⁷ ............................. H01J 1/62; H01J 63/04
(52) U.S. Cl. ...................... 313/506; 313/503; 313/498; 313/504
(58) Field of Search ............................. 313/506, 499, 313/503, 504, 498; 257/88–100

(56) References Cited

U.S. PATENT DOCUMENTS

| | | | | |
|---|---|---|---|---|
| 5,585,695 A | * | 12/1996 | Kitai ........................... | 313/506 |
| 5,616,506 A | * | 4/1997 | Takemura ................... | 438/150 |
| 5,714,790 A | * | 2/1998 | Sakamoto .................... | 257/440 |
| 5,834,893 A | * | 11/1998 | Bulovic et al. ............. | 313/508 |
| 5,888,858 A | * | 3/1999 | Yamazaki et al. ........... | 438/162 |
| 6,091,195 A | * | 7/2000 | Forrest et al. ............... | 313/504 |
| 6,246,179 B1 | * | 6/2001 | Yamada ....................... | 313/498 |
| 6,392,340 B2 | * | 5/2002 | Yoneda et al. .............. | 313/506 |
| 6,407,418 B1 | * | 6/2002 | Haga et al. .................. | 257/294 |
| 6,433,487 B1 | * | 8/2002 | Yamazaki et al. ......... | 315/169.3 |
| 6,555,969 B2 | * | 4/2003 | Yamazaki .................... | 313/504 |
| 2001/0017517 A1 | * | 8/2001 | Yamazaki .................... | 313/504 |

FOREIGN PATENT DOCUMENTS

| | | |
|---|---|---|
| JP | HEI 1-186587 | 7/1989 |
| JP | HEI 5-21158 | 1/1993 |
| JP | 2000-77181 | 3/2000 |
| JP | 2000-221907 | 8/2000 |
| JP | 2000-268978 | 9/2000 |

\* cited by examiner

*Primary Examiner*—Joseph Williams
*Assistant Examiner*—Peter Macchiarolo
(74) *Attorney, Agent, or Firm*—Scully, Scott, Murphy & Presser

(57) ABSTRACT

A light emitting device and the production method thereof are provided, which are characterized by low manufacturing costs, low power consumption, and high luminous efficiency. The production method comprises processes of forming a transparent electrode layer above a transparent substrate in order to supply current to a luminous material layer, forming the luminous material layer emitting light by supplying the current thereto on the transparent electrode layer, and forming a reflecting electrode layer on the luminous material layer in order to supply current to the luminous material layer. A plurality of opening is formed in the transparent electrode layer with a predetermined pattern. By the openings, slope sections are formed in the luminous material layer and the reflecting electrode layer. Thereby, it is possible to increase the luminous efficiency of the light emitting device.

19 Claims, 16 Drawing Sheets

F I G. 6
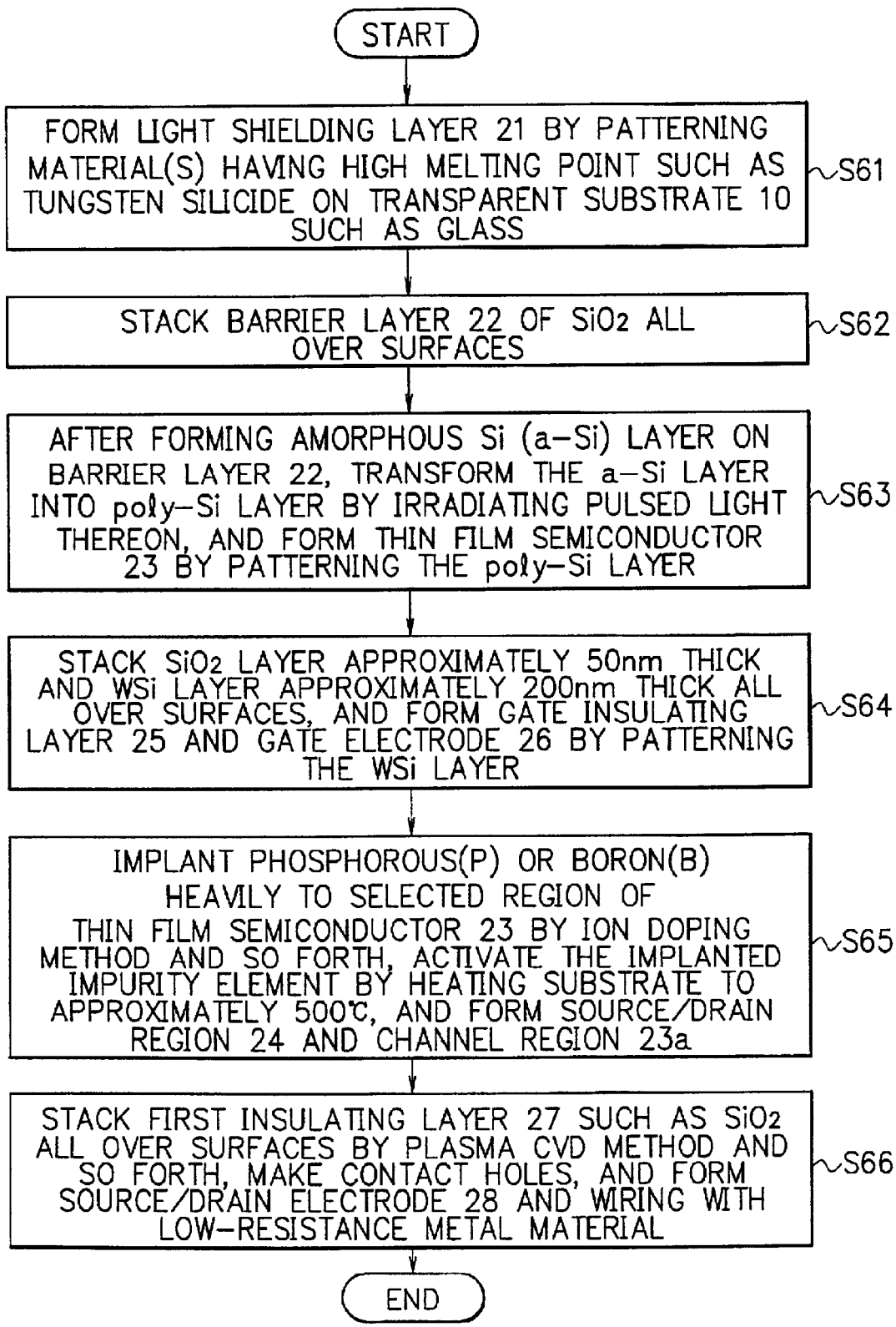

F I G. 10
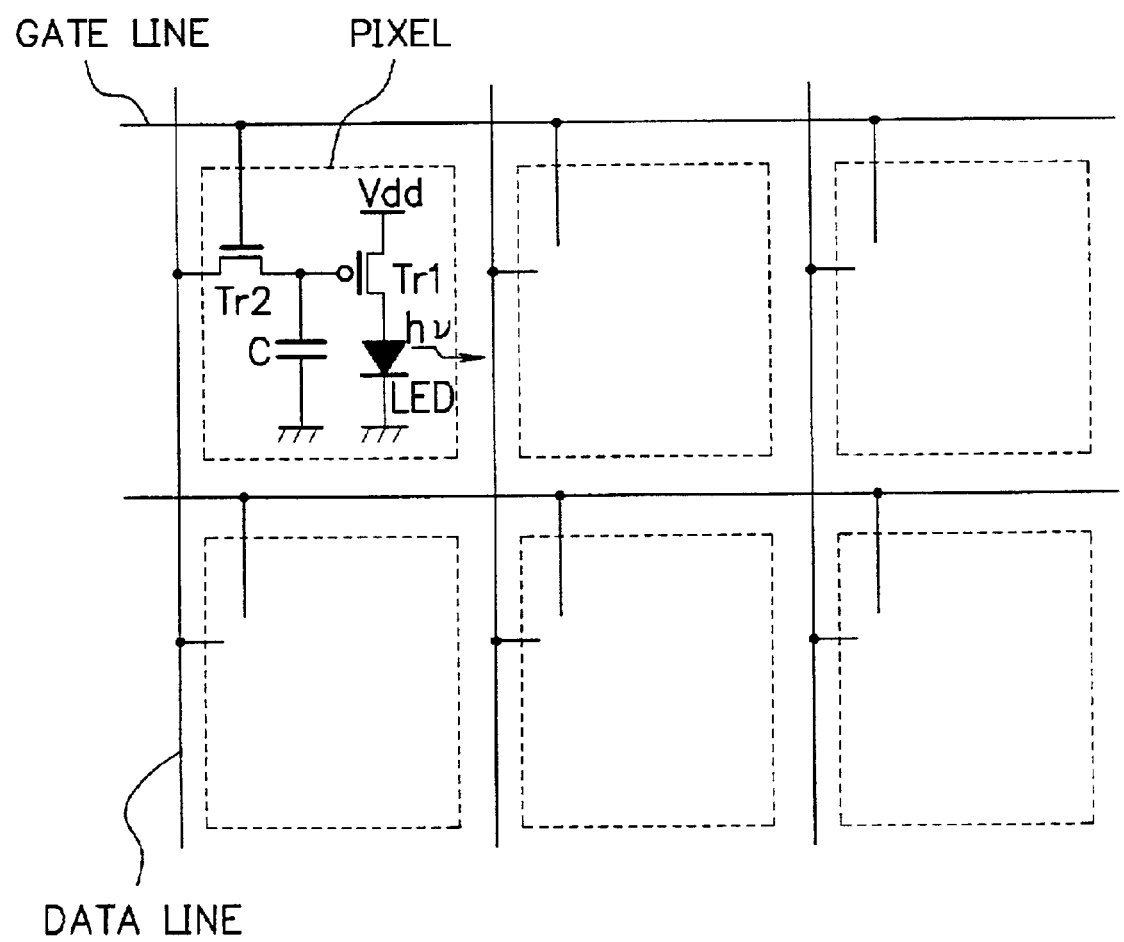

F I G. 12
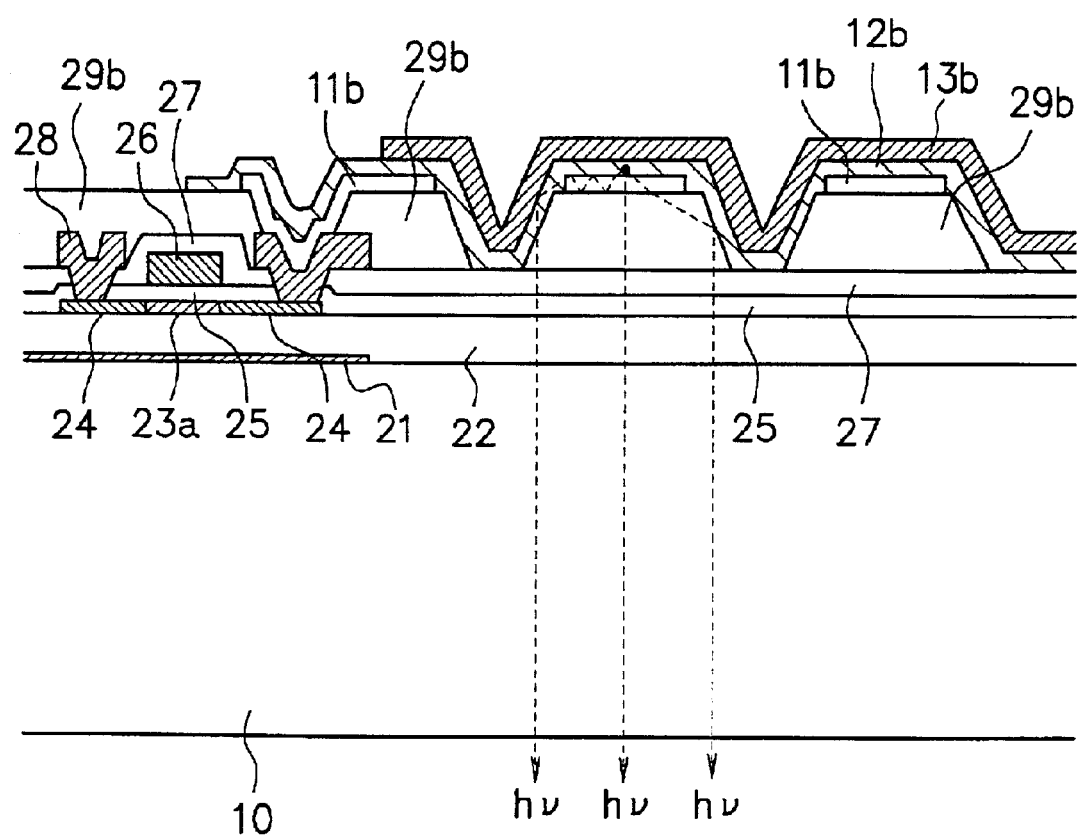

F I G. 16
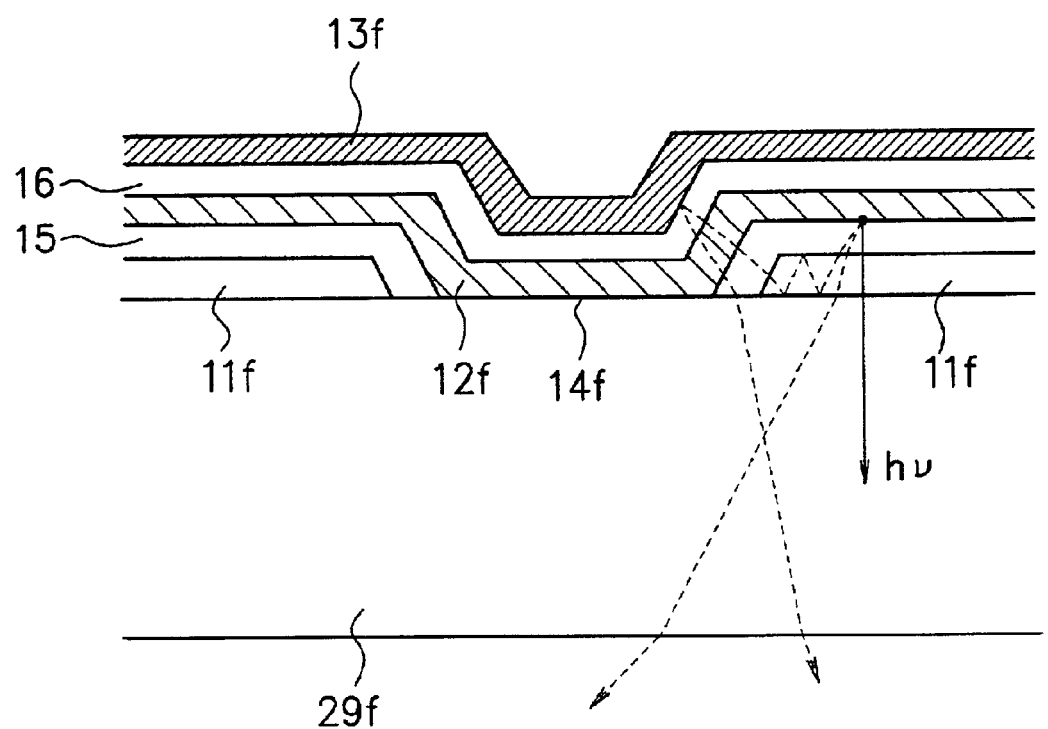

LIGHT EMITTING DEVICE AND PRODUCTION METHOD THEREOF

BACKGROUND OF THE INVENTION

The present invention relates to light emitting devices and the production method thereof used in flat displaying devices for personal digital assistances (PDAs), cellular phones, personal computers, televisions, etc., light-emitter arrays in instruments such as digital printers, scanners, facsimiles and digital copiers. In particular, the present invention relates to light emitting devices and the production method thereof wherein low power consumption, low manufacturing costs, and in addition, high luminous efficiency are realized.

DESCRIPTION OF THE RELATED ART

Inorganic or organic Electroluminescence (EL) materials have been developed and applied for light emitting devices used in flat panel displays for PDAs, cellular phones, etc. as well as in light-emitter arrays in digital printers. Some of these devices have already been put to practical use. There are two ways to drive these light emitting devices. A "passive drive system" has a configuration wherein organic materials are sandwiched by a pair of orthogonal strip-shaped electrodes. An "active drive system" has a configuration wherein a light emitting device using organic materials is driven by a thin film transistor (TFT) circuit provided for each pixel. Compared to the passive drive system, the active drive system has characteristics that luminous efficiency is higher, and images can be displayed with quicker response, etc. Thereby, recently, researches and developments for the organic EL displays by the active drive system have been accelerated.

Incidentally, there is a limit to capacity of a battery used in a compact cellular phone, etc. Thereby, it is important to increase the luminous efficiency of the light emitting devices. Besides, by the increase of the luminous efficiency, printing speed and image input speed can be also enhanced in the case of the light emitting devices used as a light source of printers, scanners, and so on.

However, in the conventional light emitting devices using inorganic or organic materials, it is a problem that some rays emitted from the EL materials are trapped within the devices. Thereby, less luminous energy is given off from the devices.

FIG. 1 is a diagram showing a configuration of a conventional light emitting device using organic materials. The light emitting device is made by stacking a transparent electrode 111, a luminous material layer 112, and a reflecting electrode 113 in this order on a transparent substrate 110. The transparent electrode 111 is made of indium tin oxide (ITO), etc. The luminous material layer 112 is made of an organic material(s) such as quinolinelate alumino complex (Alq), etc. The reflecting electrode 113 is made of aluminum/lithium alloy, etc. The transparent substrate 110 is made of glass, etc. Each refractive index of the transparent substrate 110, the transparent electrode 111 and the luminous material layer 112 for visible light is in the ranges of 1.5 to 1.65, 1.9 to 2.0, and approximately 1.7, respectively.

In general, when current is applied to the luminous material layer 112, light is given off isotropically. First, a case is examined in which light is emitted from a light emitting point P in the luminous material layer 112 in the direction toward the transparent substrate 110. The following cases are conceivable depending on a direction of the emitted light at an angle with a normal direction of the transparent substrate 110. When the angle is adequately small, the light goes into the transparent electrode 111 and is emitted outside of the light emitting device through the transparent substrate 110 as ray 1 shown in FIG. 1. When the angle becomes a little larger, the light is totally reflected at the interface between the transparent substrate 110 and the outside of the light emitting device, and is trapped within the transparent substrate 110 as ray 2 shown in FIG. 1 (usually, since the outside is filled with air, its refractive index is 1.0). When the angle becomes much larger, the light is totally reflected at the interface between the transparent substrate 110 and the transparent electrode 111, and is trapped within the transparent electrode 111 as ray 3 shown in FIG. 1.

On the other hand, a case is examined in which light is emitted from the point P in the direction toward the reflecting electrode 113. The light is reflected by the reflecting electrode 113, and goes in the direction toward the transparent electrode 111. Then, depending on the angle, the light follows the same track as the above-described cases. Rays are emitted from the luminous material layer 112 isotropically. Some rays whose incident angles are larger than the critical angle for the total internal reflection are trapped within the light emitting device. Namely, the trapped light cannot be taken out to the outside of the light emitting device.

Some efforts to reduce the rays trapped within the light emitting device, and to increase the luminous efficiency are disclosed. For example, they are disclosed in Japanese Patent Application Laid-Open No. HEI1-186587, Japanese Patent Application Laid-Open No. HEI5-21158 and Japanese Patent Application Laid-Open No. 2000-77181.

As an example for such a conventional light emitting device, a configuration of a light emitting device disclosed in Japanese Patent Application Laid-Open No. HEI1-186587 is shown in FIG. 2. This light emitting device is made by inorganic materials. The light emitting device is constituted by stacking a transparent electrode 111b, a first insulating layer 115b, a luminous material layer 112b, a second insulating layer 116b, and a reflecting electrode 113b on a transparent substrate 110b whose surface has concave and convex shapes. The light emitting device has a concave and convex shape. Height of the concavities and convexities are set larger than the thickness of the luminous material layer 112b. The stepped sections are configured so that the reflecting electrode 113b may not overlap with the transparent electrode 111b. This configuration prevents electrical short circuits at the stepped sections of the concavities and convexities. In this patent application, the thin layers piled up on the transparent substrate 110b are fabricated by photolithography, reactive ion etching process steps, etc. Thereby, it is possible to form the concave and convex shapes having a moderate taper repetitively.

Next, an explanation is given of the operation. Some rays of the light emitted from the luminous material layer 112b are reflected at the stepped sections that are formed owing to the concavities and convexities of the transparent substrate 110b. Thereby, the rays can be taken out from the transparent substrate 110b to the outside, and utilized for the display. When a displaying device is configured by arranging a plurality of the light emitting devices as described above, the stepped sections formed by the concavities and convexities of the transparent substrate 110b exist between adjacent pixels. Thereby, rays emitted from the luminous material layer 112b in a certain pixel cannot reach the adjacent pixel. Therefore, it is possible to prevent contrast deterioration of the displaying device caused by stray light from adjacent pixels.

However, there are some problems in the above-described light emitting device as follows.

First, forming the concavities and convexities on the substrate requires additional processes of a layer forming process, an exposing process, an etching process, etc. Therefore, the manufacturing process gets more complicated, raising manufacturing costs, and mass-production becomes difficult.

Second, when rays repeat total internal reflection within the light emitting device, some rays are absorbed by the materials of the luminous material layer and the transparent electrode. Assuming that output devices such as displays and light-emitter arrays are configured by arranging a plurality of pixels including the light emitting devices, the larger one pixel is, the longer the distance from the light emitting point to the stepped sections at the luminous section in each pixel is. Therefore, some rays of the propagated light are absorbed by the luminous material layer and the transparent electrode. Consequently, after reaching the stepped sections, the ratio of the rays that can be taken out from the light emitting device is reduced. Further, the reflecting electrode is generally formed by using a high-reflectance (metal) material. It is impossible to make the reflectance 100% perfectly. Thereby, effectively outputted light is reduced by repeating the multiple reflection, and the ratio of the rays that can reach the stepped sections is reduced. In the above patent application, there is no consideration for this self-absorption by the materials and the light loss during the multiple reflection. Thereby, there is no suggestion about the countermeasures in order to improve the configuration.

SUMMARY OF THE INVENTION

It is therefore an object of the present invention to provide a light emitting device and the production method thereof by which high luminous efficiency, low power consumption, and low manufacturing costs are realized.

According to a first aspect of the present invention, for achieving the object mentioned above, there is provided a light emitting device, wherein:

a thin film transistor (TFT) is fabricated on an insulating base material;

a luminous section including a luminous material layer and electrode layers supplying current to the luminous material layer are fabricated above the TFT; and a predetermined pattern having a plurality of opening is developed to the insulating base material or at least one material placed above the insulating base material and below the luminous material layer.

According to a second aspect of the present invention, there is provided a light emitting device, wherein:

at least a first electrode layer to supply current to a luminous material layer, the luminous material layer emitting light by supplying current thereto, and a second electrode layer to supply current to the luminous material layer are stacked above an insulating base material;

at least one of the first electrode layer and the second electrode layer is made of a transparent material; and a predetermined pattern having a plurality of opening is developed to the electrode layer made of the transparent material, and concavities and convexities are formed to the luminous material layer and the other electrode layer owing to the plurality of opening.

According to a third aspect of the present invention, there is provided a light emitting device, wherein:

at least a first electrode layer to supply current to a luminous material layer, the luminous material layer emitting light by supplying current thereto, and a second electrode layer to supply current to the luminous material layer are stacked above an insulating base material;

at least one of the first electrode layer and the second electrode layer is made of a transparent material; and the electrode layer made of the transparent material has a comb shape in plane view, and the luminous material layer and the other electrode layer stacked on the electrode layer made of the transparent material are formed in the shape of concavities and convexities in side view.

According to a fourth aspect of the present invention, there is provided a light emitting device, wherein:

a TFT is fabricated on an insulating base material;

at least an insulating layer, a first electrode layer to supply current to a luminous material layer, the luminous material layer emitting light by supplying current thereto, and a second electrode layer to supply current to the luminous material layer are stacked above the TFT;

the first electrode layer is made of a transparent material;

the second electrode layer is made of a reflecting material;

a predetermined pattern having a plurality of opening is formed to the insulating base material or at least one material placed above the insulating base material and below the luminous material layer; and the first electrode layer is formed on convex sections of the insulating layer formed owing to the plurality of opening.

According to a fifth aspect of the present invention, there is provided a light emitting device, wherein:

a TFT is fabricated on an insulating base material;

at least an insulating layer, a first electrode layer to supply current to a luminous material layer, the luminous material layer emitting light by supplying current thereto, and a second electrode layer to supply current to the luminous material layer are stacked above the TFT;

the second electrode layer is made of a transparent material;

the first electrode layer is made of a reflecting material;

a predetermined pattern having a plurality of opening is formed to the insulating base material or at least one material placed above the insulating base material and below the luminous material layer; and the second electrode layer is formed on concave sections of the luminous material layer formed owing to the plurality of opening.

According to a sixth aspect of the present invention, the luminous material layer is made of organic materials.

According to a seventh aspect of the present invention, the luminous material layer is made of inorganic materials, a first insulating layer is formed between the luminous material layer and the first electrode layer, and a second insulating layer is formed between the luminous material layer and the second electrode layer.

According to an eighth aspect of the present invention, there is provided a production method of a light emitting device formed through a thin film transistor (TFT) fabrication process fabricating a TFT on an insulating base material and a luminous section fabrication process fabricating a luminous section including a luminous material layer and electrode layers supplying current to the luminous material layer above the TFT, comprising a process of developing a predetermined pattern having a plurality of opening to the insulating base material or at least one material placed above the insulating base material and below the luminous material layer in the TFT fabrication process or the luminous section fabrication process.

According to a ninth aspect of the present invention, there is provided a production method of a light emitting device comprising steps of:

forming a first electrode layer to supply current to a luminous material layer above an insulating base material;

forming the luminous material layer emitting light by supplying current thereto on the first electrode layer; and forming a second electrode layer to supply current to the luminous material layer on the luminous material layer, wherein:

at least one of the first electrode layer and the second electrode layer is made of a transparent material; and a predetermined pattern having a plurality of opening is developed to the electrode layer made of the transparent material, and concavities and convexities are formed to the luminous material layer and the other electrode layer owing to the plurality of opening.

According to a tenth aspect of the present invention, there is provided a production method of a light emitting device comprising steps of;

forming a first electrode layer to supply current to a luminous material layer above an insulating base material;

forming the luminous material layer emitting light by supplying current thereto on the first electrode layer; and forming a second electrode layer to supply current to the luminous material layer on the luminous material layer, wherein:

at least one of the first electrode layer and the second electrode layer is made of a transparent material; and the electrode layer made of the transparent material has a comb shape in plane view, and the luminous material layer and the other electrode layer stacked on the electrode layer made of the transparent material are formed in the shape of concavities and convexities in side view.

According to an eleventh aspect of the present invention, there is provided a production method of a light emitting device comprising steps of:

fabricating a TFT on an insulating base material;

forming an insulating layer above the insulating base material on which the TFT is fabricated;

forming a first electrode layer to supply current to a luminous material layer on the insulating layer;

forming the luminous material layer emitting light by supplying current thereto on the first electrode layer; and forming a second electrode layer to supply current to the luminous material layer on the luminous material layer, wherein:

the first electrode layer is made of a-transparent material;

the second electrode layer is made of a reflecting material;

a predetermined pattern having a plurality of opening is formed to the insulating base material or at least one material placed above the insulating base material and below the luminous material layer in the TFT fabrication process or the insulating layer forming process; and the first electrode layer is formed on convex sections of the insulating layer formed owing to the plurality of opening.

According to a twelfth aspect of the present invention, there is provided a production method of a light emitting device comprising steps of:

fabricating a TFT on an insulating base material;

forming an insulating layer above the insulating base material on which the TFT is fabricated;

forming a first electrode layer to supply current to a luminous material layer on the insulating layer;

forming the luminous material layer emitting light by supplying current thereto on the first electrode layer; and forming a second electrode layer to supply current to the luminous material layer on the luminous material layer, wherein:

the second electrode layer is made of a transparent material;

the first electrode layer is made of a reflecting material;

a predetermined pattern having a plurality of opening is formed to the insulating base material or at least one material placed above the insulating base material and below the luminous material layer in the TFT fabrication process or the insulating layer forming process; and the second electrode layer is formed on concave sections of the luminous material layer formed owing to the plurality of opening.

BRIEF DESCRIPTION OF THE DRAWINGS

The object and features of the present invention will become more apparent from the consideration of the following detailed description taken in conjunction with the accompanying drawings in which:

FIG. 6 is a flowchart showing a manufacturing procedure of the light emitting device according to the first embodiment;

FIG. 10 is a circuit diagram showing main components of the light emitting device according to the first embodiment;

FIG. 12 is a diagram explaining main components of a light emitting device according to a second embodiment of the present invention;

FIG. 16 is a diagram explaining main components and an operation of a light emitting device according to a fourth embodiment of the present invention.

DESCRIPTION OF THE PREFERRED EMBODIMENTS

Figure 1:
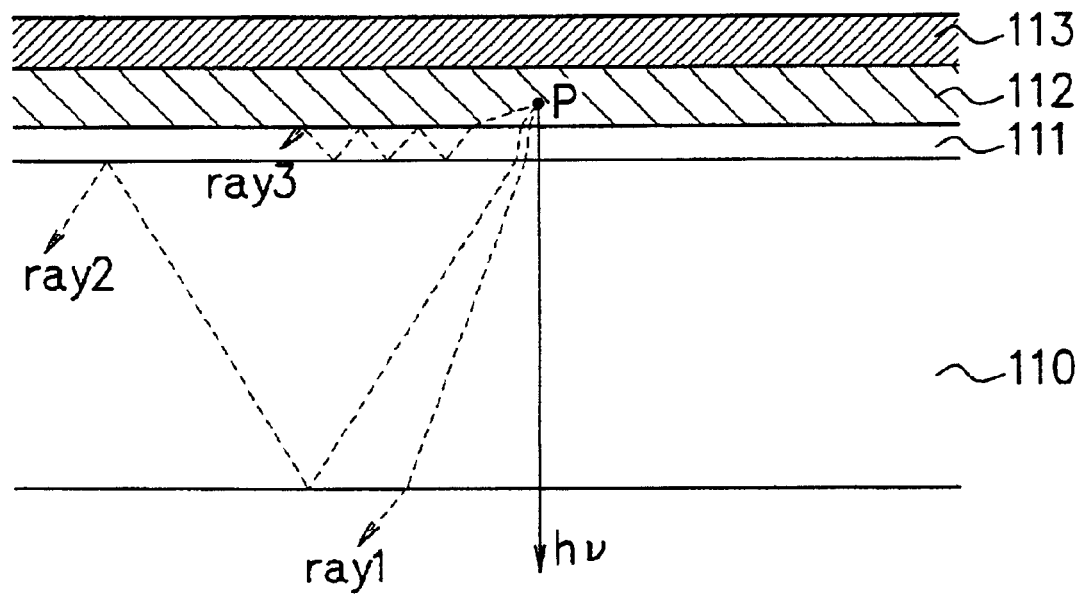
FIG. 1 is a diagram showing a configuration of a conventional light emitting device.

Referring now to the drawings, embodiments of the present invention will be explained in detail.

Figure 3:
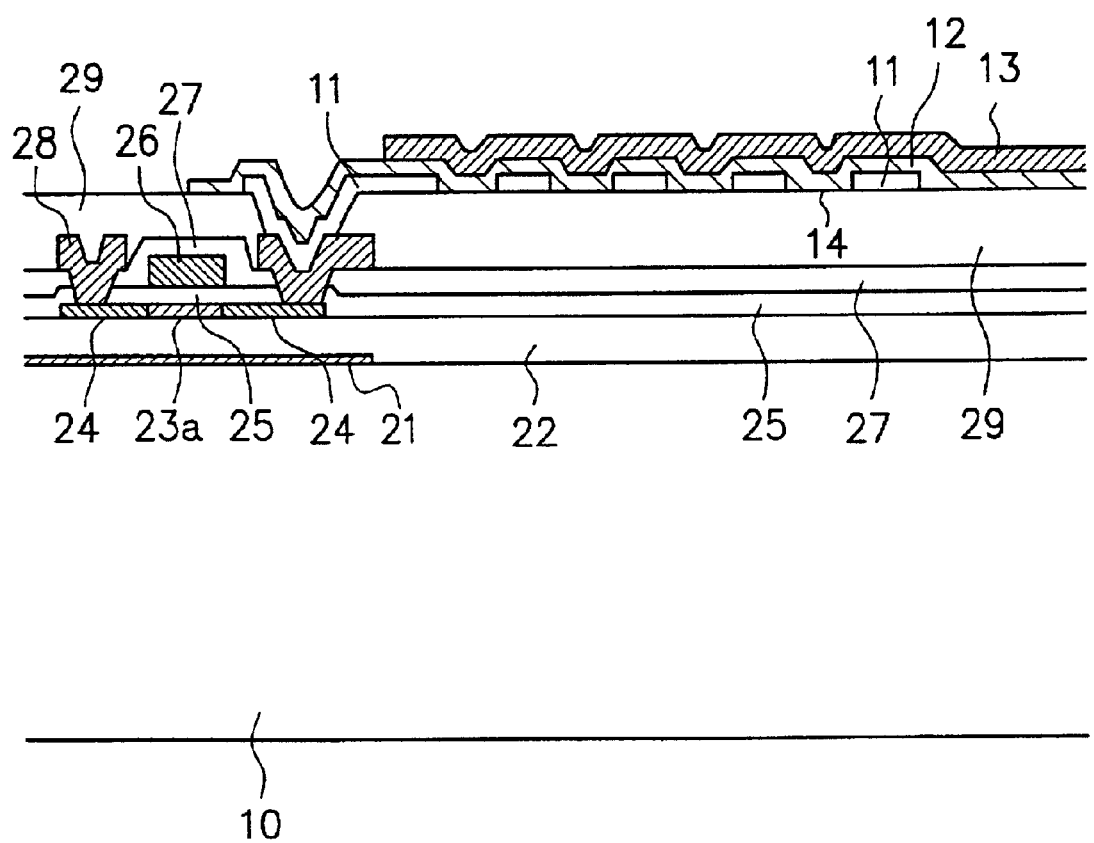
FIG. 3 is a diagram explaining main components of a light emitting device and the configuration thereof according to a first embodiment of the present invention.

FIG. 3 shows main components of a light emitting device and an example of the configuration thereof according to a first embodiment. The light emitting device comprises a luminous section fabricated above a transparent substrate 10 by a series of layer forming processes described later, and a thin film transistor (TFT) circuit to drive the luminous section.

As shown in FIG. 3, the luminous section is configured by sandwiching a luminous material layer 12 made by organic electroluminescence (EL) materials between a transparent electrode 11 and a reflecting electrode 13. Light is emitted from the luminous material layer 12 sandwiched between the both electrodes. A part of the transparent electrode 11 is connected to a source/drain electrode 28. The reflecting electrode 13 is connected to an external wire(s) (not shown in FIG. 3).

Figure 4:
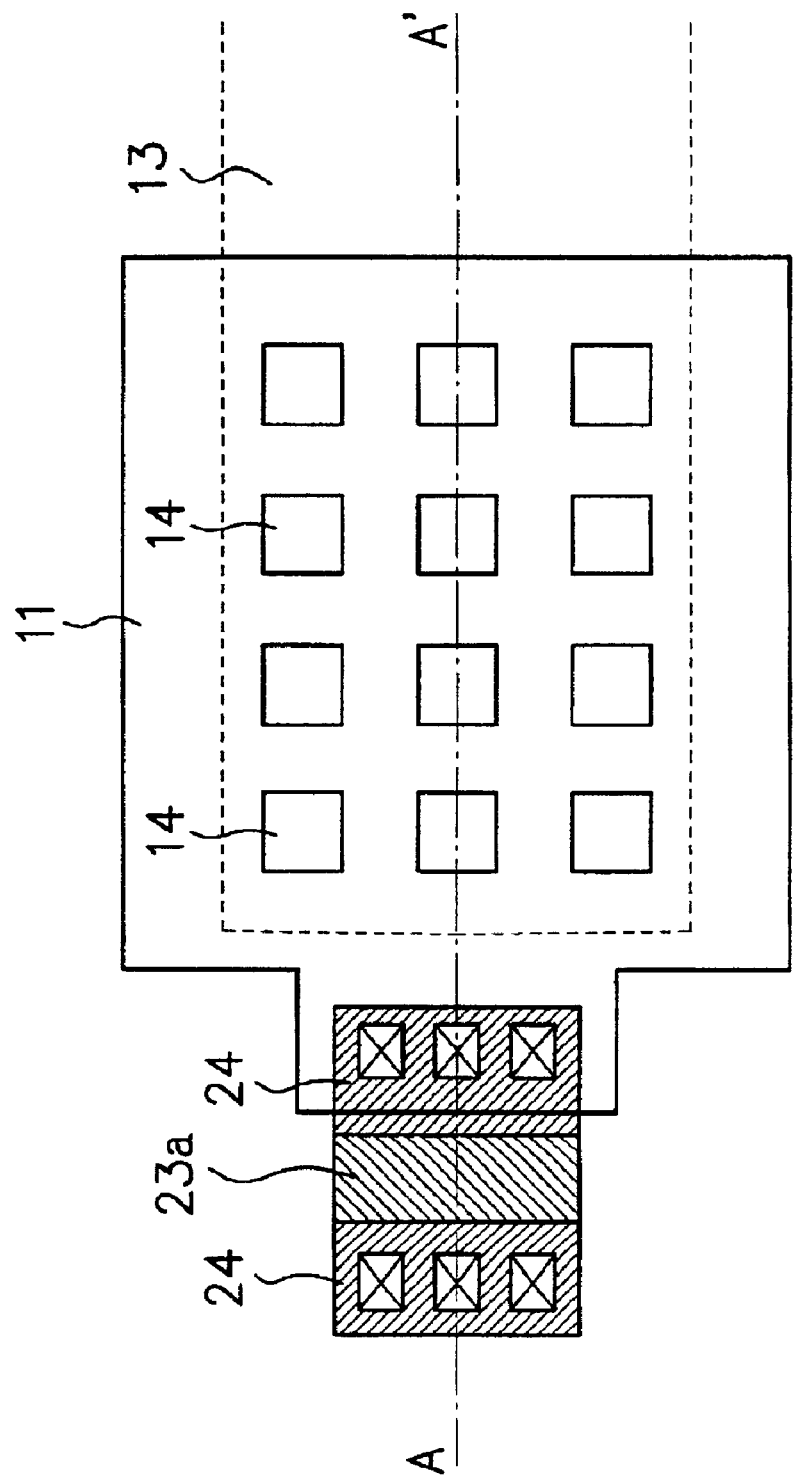
FIG. 4 is a top plane view showing a plane shape of the light emitting device according to the first embodiment.
Figure 5:
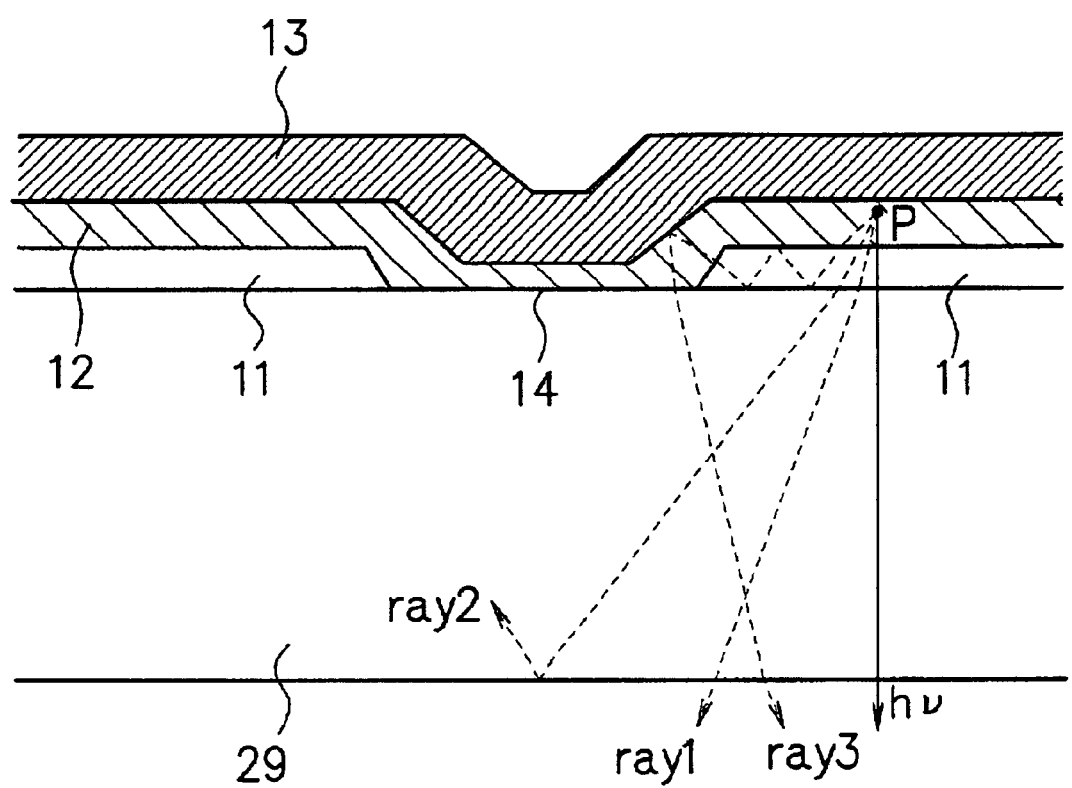
FIG. 5 is a cross-sectional view explaining operations of the light emitting device according to the first embodiment.

FIG. 4 is a top plane view showing an arrangement of the components of the luminous section and the TFT. The cross section along the A–A' shown in FIG. 4 corresponds to FIG. 3 described above. As shown in FIG. 4, a plurality of opening 14 is made in the transparent electrode 11. Besides, the luminous material layer 12 is set in the regions of the openings 14 as shown in FIG. 3. FIG. 5 is a cross-sectional diagram wherein a part of the transparent electrode 11, luminous material layer 12 and reflecting electrode 13 shown in FIG. 3 is magnified. Slope sections as shown in FIGS. 3 and 5 are made in the reflecting electrode 13 because the transparent electrode 11 does not exist in the openings 14, and further, because a moderate taper is made in the vicinity of each end of the transparent electrode 11.

Figure 7:
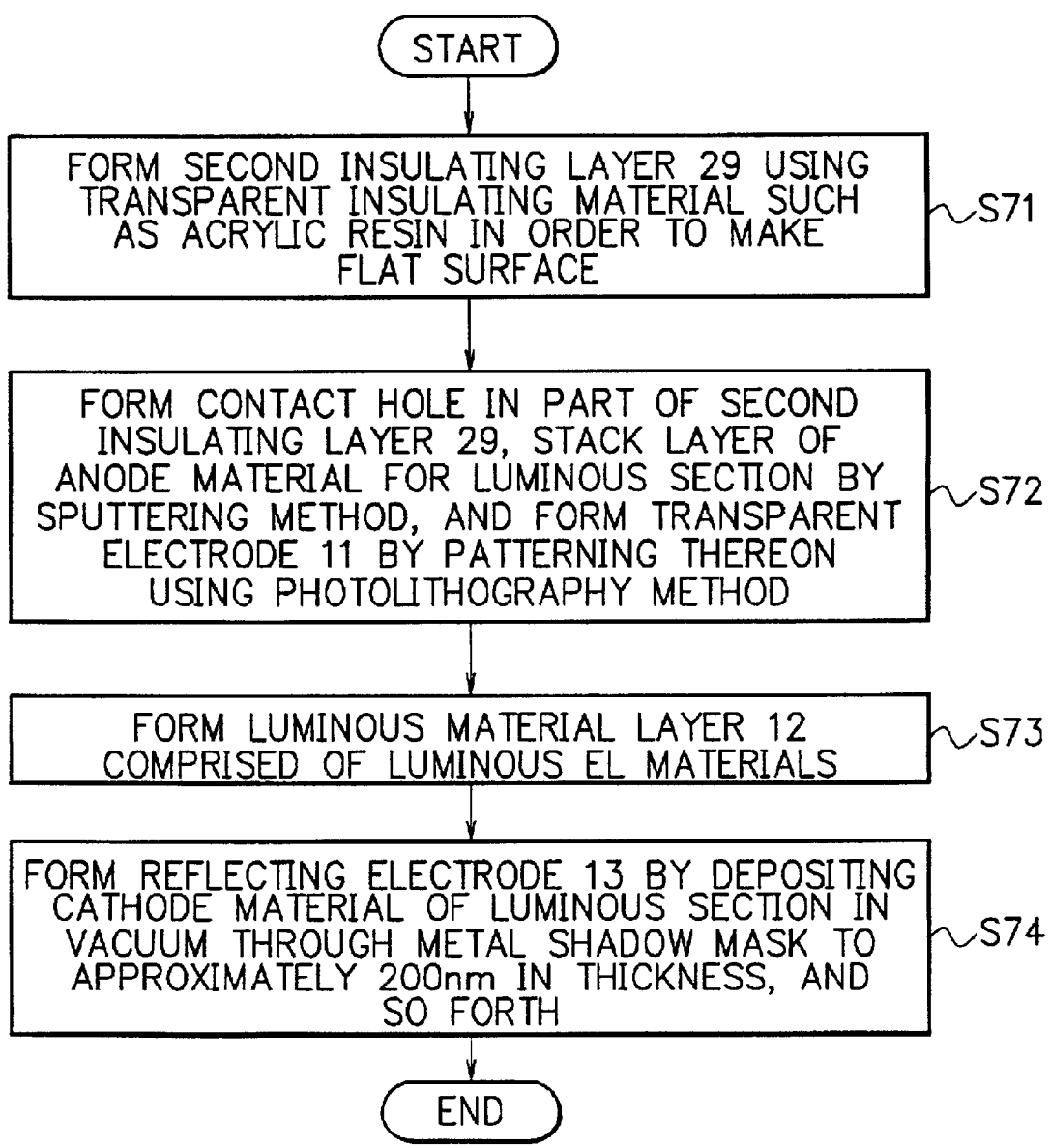
FIG. 7 is a flowchart showing a manufacturing procedure of the light emitting device according to the first embodiment.

Now, referring to flowcharts shown in FIGS. 6 and 7, and diagrams shown in FIGS. 8A to 9D, manufacturing processes of the light emitting device will be explained. The manufacturing processes are divided roughly into a TFT-process to fabricate TFT shown in FIGS. 6 and 8A to 8F, and an EL-process to form the luminous section using organic EL materials shown in FIGS. 7 and 9A to 9D.

In the TFT-process (TFT-fabrication process), a wide variety of TFTs can be employed. This embodiment will be explained by taking a top-gate polycrystalline silicon (poly-Si) TFT as an example.

Figure 8A:
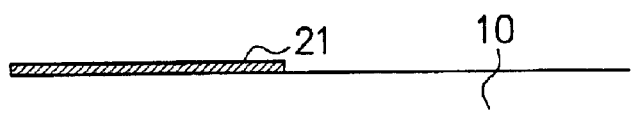
FIGS. 8A to 8F are diagrams showing a configuration of the light emitting device in each manufacturing process.

First, a material(s) having high-melting point such as tungsten silicide (WSi) is formed on the transparent substrate 10 such as glass for an insulator by a sputtering method, etc. Then, a light shielding layer 21 is formed by patterning the material by photolithography (Step S61). In the case of using WSi, 100 to 200 nm in thickness is enough to serve as the light shielding layer 21. FIG. 8A shows a state where the light shielding layer 21 is formed on the transparent substrate 10 by a predetermined pattern.

Figure 8B:
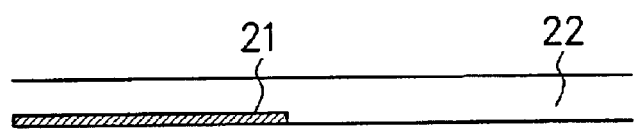

Secondly, a barrier layer 22 of $SiO_2$ is formed all over the surfaces by means of chemical vapor deposition (CVD) by which oxygen and gas including Si such as silane ($SiH_4$) are decomposed in plasma and deposited on the substrate (Step S62). This barrier layer 22 prevents impurity elements, which might be present in the transparent substrate 10, from being diffused into the upper layers formed by the following processes. The thickness of the barrier layer 22 is 300 to 500 nm. FIG. 8B shows a state where the barrier layer 22 is formed on the transparent substrate 10 and the light shielding layer 21.

Figure 8C:
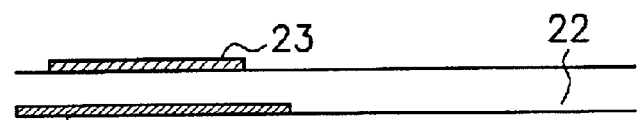

Thirdly, an amorphous Si (a-Si) layer approximately 100 nm thick, which is a precursor layer of a poly-Si layer, is formed thereon. This a-Si layer is formed by one of the various layer forming methods such as plasma CVD, low-pressure CVD, a sputtering method or the like. Then, ultrashort pulsed light of dozens of nanosecond duration is irradiated thereon by an excimer laser. Thereby, the a-Si layer is melt instantaneously, and is transformed into the poly-Si layer. If the irradiating energy density is approximately 400 mJ/cm$^2$, a superior characteristic poly-Si layer is obtained. Then, the poly-Si layer is patterned by a photolithography method. Thereby, a thin film semiconductor 23 is formed (Step S63). FIG. 8C shows a state where the thin film semiconductor 23 is formed on the barrier layer 22.

Figure 8D:
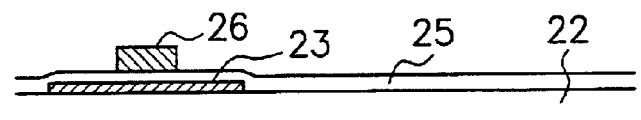

Fourthly, a $SiO_2$ layer approximately 50 nm thick and a WSi layer approximately 200 nm thick are formed all over the surfaces by the same method as above. Then, the WSi layer is patterned by a photolithography method. Thereby, a gate insulating layer 25 and a gate electrode 26 are formed (Step S64). FIG. 8D shows a state where the gate insulating layer 25 is formed on the barrier layer 22 and the thin film semiconductor 23, and the gate electrode 26 is formed on the gate insulating layer 25.

Figure 8E:
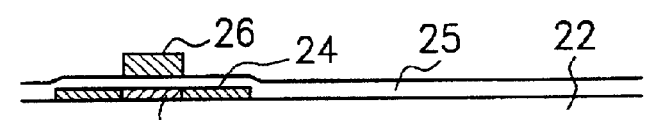

Fifthly, phosphorous (P) or boron (B) is implanted heavily to the selected region of the thin film semiconductor 23 by an ion doping method or the like. Then, the implanted impurity element is activated by heating the substrate to approximately 500° C. In this process, the process conditions such as the concentration, heating time, temperature, and so forth are important. These conditions should be determined so as to obtain a good ohmic contact between the thin film semiconductor 23 and a wiring material used in the following process. By this means, a source/drain region 24 of TFT is formed (Step S65). The remaining region to which the impurity element is not implanted becomes a channel region 23a of TFT. FIG. 8E shows a state where the source/drain region 24 of TFT is formed in the thin film semiconductor 23.

Figure 8F:
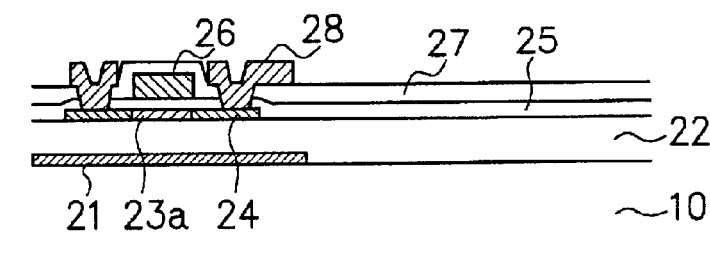

Lastly, a first insulating layer 27 of $SiO_2$, etc. is formed all over the surfaces by plasma CVD or the like. Then, contact holes are made, and a source/drain electrode 28 and a wiring(s) are formed with a low-resistance metal material(s) (Step S66). Thereby, the TFT manufacturing pro-processes are finished. FIG. 8F shows a state where the first insulating layer 27 is formed on the gate insulating layer 25 and the gate electrode 26, and the source/drain electrode 28 is formed after making the contact holes.

Figure 9A:
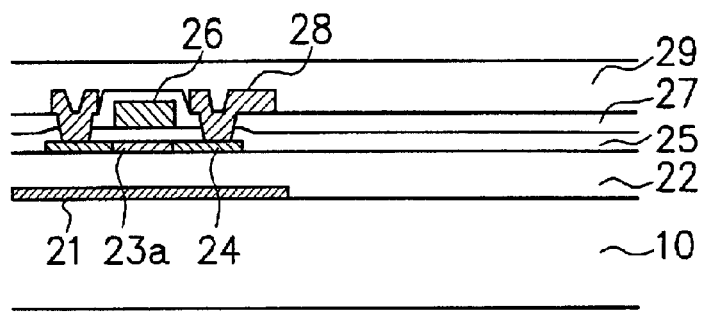
FIGS. 9A to 9D are diagrams showing a configuration of the light emitting device in each manufacturing process.

Next will be an explanation of the EL-process (EL-fabrication process) to fabricate the luminous section. First, by using a transparent insulating material such as acrylic resin, a second insulating layer 29 is formed all over the surfaces of the first insulating layer 27 and the source/drain electrode 28 (Step S71). This process is employed to make a flat surface. FIG. 9A shows a state where the second insulating layer 29 is formed all over the surfaces.

Figure 9B:
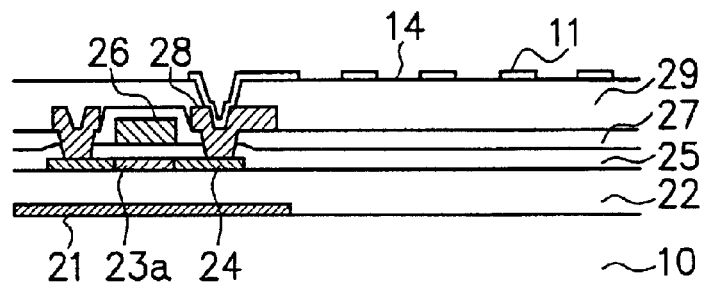

Secondly, a contact hole is made in the part of the second insulating layer 29. Then, a layer of an anode material such as indium tin oxide (ITO) for the luminous section is stacked all over the surfaces by a sputtering method. Then, the layer is patterned by a photolithography method. By this means, the transparent electrode 11 having the openings 14 is formed (Step S72). When ITO is used for the anode material, it is preferable that its sheet resistance is less than approximately 20/□, and its thickness is approximately 100 nm. FIG. 9B shows a state where the transparent electrode 11 is formed on the second insulating layer 29 with a predetermined pattern.

Figure 9C:
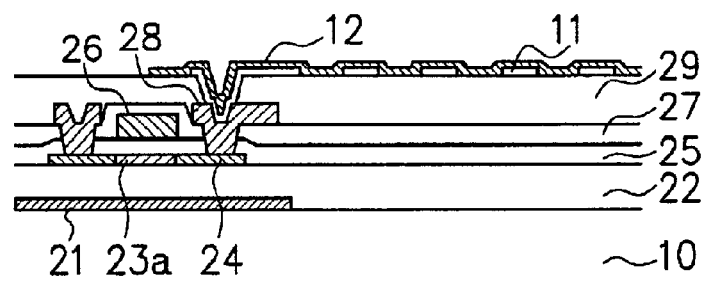

Thirdly, as shown in FIG. 9C, the luminous material layer 12 of organic EL materials is formed to the region for the luminous section (Step S73). There are some known configurations for the luminous material layer 12. For example, a double layer configuration consisting of a luminous material layer and a hole transporting layer, a triple layer configuration by adding an electron transporting layer to the double layer configuration, a configuration wherein a thin insulating layer is formed at the interface of a metal electrode, etc. Any of these configurations can be applied for the luminous material layer 12 shown in FIG. 3. There are some known forming methods for the luminous material layer 12. For example, a spin coating method, a vacuum evaporation method, an ink jet printing method, etc. Depending on the method selected therefrom, there are determined the corresponding forming conditions such as selecting an organic EL material to be used, such as polymer, oligomer, or low moleculer weight materials, configuration of a substrate, forming method of an upper electrode, etc. In this embodiment, for example, at least one material selected from triaryl amine derivatives, oxadiazole derivatives, porphyrin derivatives, etc. is used for the hole transporting layer. Further, at least one material selected from 8-hydroxyquinoline and the derivative(s) metal complex thereof, tetraphenyl butadiene derivatives, di-styryl aryl derivatives, etc. is used for the luminous material layer. The luminous material layer 12 is formed by stacking each of the two materials selected from the above ones or more to approximately 50 nm thick by a vacuum evaporation method. Incidentally, the luminous material layer 12 is patterned with a certain pattern so as to cover almost all over the transparent electrode 11. However, the luminous material layer 12 is made of insulating materials, so that there is no need to pattern thereon. Namely, the luminous material layer 12 may cover all over the surfaces. However, in the case of applying the luminous material layer 12 to a color display, at least three kinds of luminous material layers and the separation thereof are needed. Thereby, the luminous material layer 12 has to be patterned.

Figure 9D:
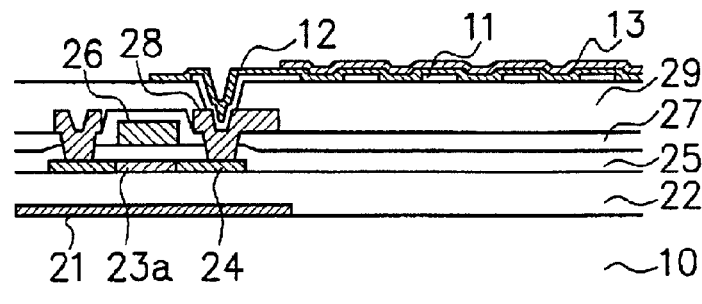

Lastly, a reflecting electrode 13 is formed on the luminous material layer 12 by depositing a cathode material of the luminous section, such as an aluminum-lithium alloy, etc., in vacuum through a metal shadow mask to approximately 200 nm in thickness, and so forth (Step S74). FIG. 9D shows a state where the reflecting electrode 13 is formed on the luminous material layer 12, and slope sections are formed in the luminous material layer 12 and the reflecting electrode 13 owing to the openings made in the transparent electrode 11.

Figure 2:
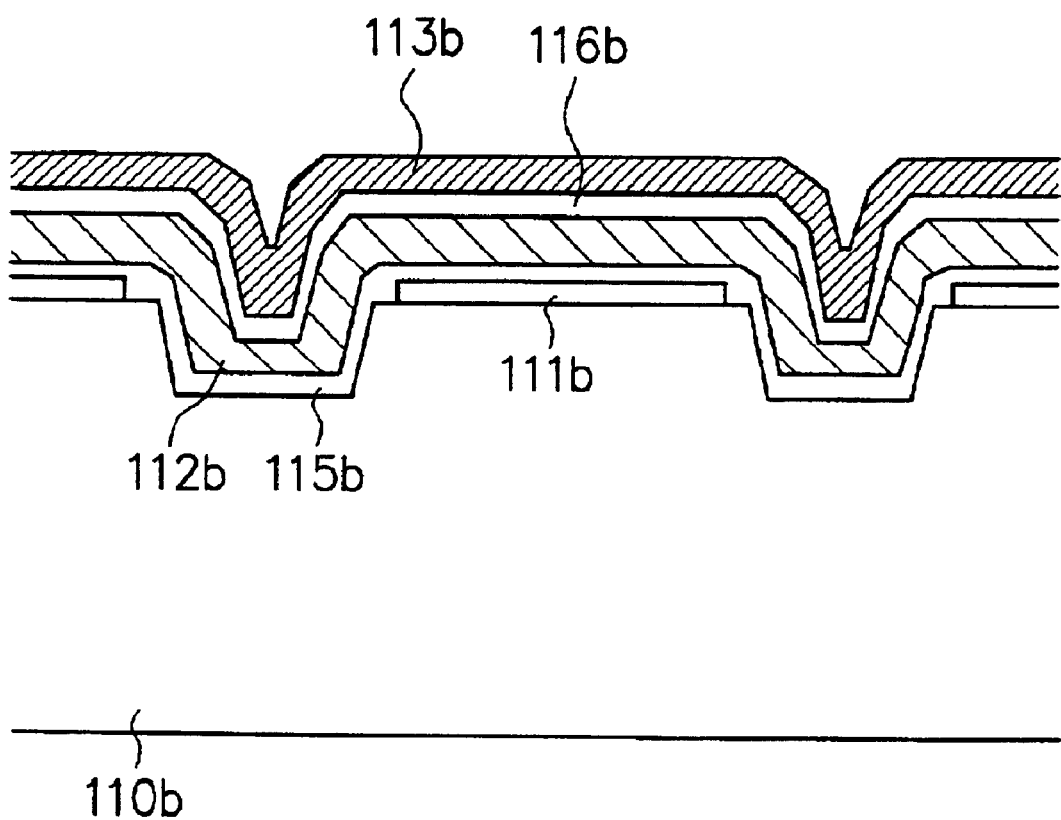
FIG. 2 is a diagram showing a configuration of a conventional light emitting device.

By this means, the present embodiment is characterized by making the openings in the transparent electrode 11 in order to increase luminous efficiency of the light emitting device. Therefore, comparing to the manufacturing processes in forming the concavities and convexities on the substrate shown in FIG. 2, there is no need to add a layer forming process, a photolithography process, and an etching process. Thereby, it is possible to reduce the manufacturing costs.

FIG. 10 shows a circuit diagram showing how to drive a plurality of the light emitting device arranged regularly. The luminous section is denoted by the symbol of "LED (light emitting diode)". A TFT denoted by a symbol of "Tr1" is connected to one end of the LED to supply current to the LED. Further, a capacitance C to keep a constant potential of the gate of the Tr1, and a Tr2 to charge C to a predetermined voltage corresponding to a video signal are connected to the Tr1 as shown in FIG. 10. The drain electrode of the Tr1 is connected to a power source Vdd. Hereinafter, a circuit surrounded by a dotted line will be referred to as a pixel. As shown in FIG. 10, a plurality of TFT circuit is provided in order to drive the regularly arranged plural pixels. Incidentally, it is preferable that these TFT circuits are configured using polycrystal silicon (poly-Si). In particular, it is preferable that CMOS circuits are configured using both of n-type TFTs and p-type TFTs.

Next, referring to FIGS. 3, 5 and 10, the operation of the light emitting device will be explained. First, a control signal is supplied to each gate line shown in FIG. 10 one at a time from the top gate line. Thereby, all of the Tr2s of the pixels connected to a particular gate line selected by the control signal are turned on. Synchronized with the control signal, video signals indicating image data (that is to be displayed) are sent from each data line to the conducting Tr2s. Then, the video signals are stored in capacitances C. When the video signals are stored in the capacitances C, predetermined current corresponding to each of the video signals is supplied to the light emitting device LED of each of the pixels. Then, light is emitted from the luminous material layer 12 isotropically.

Suppose that rays emitted in the direction toward the transparent electrode 11 from a light emitting point P. When the angle with the normal direction of the transparent substrate 10 is small, the ray (ray 1 shown in FIG. 5) transmits through the transparent electrode 11, second insulating layer 29, first insulating layer 27, . . . , and the transparent substrate 10 (not shown) in this order. By this means, the ray reaches an observer. When the angle becomes larger, the ray (ray 2 shown in FIG. 5) is trapped within the second insulating layer 29 due to the total internal reflection. Further, when the angle becomes much larger, the ray (ray 3 shown in FIG. 5) is trapped within the transparent electrode 11. The total internal reflection is caused because the refractive index of the transparent electrode 11 is larger than that of the second insulating layer 29 (for example, when using ITO for the transparent electrode 11, the refractive index is 1.9 to 2.0, and when using $SiO_2$ for the second insulating layer 29, its refractive index is approximately 1.5). However, the distance from the light emitting point P to the end of the transparent electrode 11 is short. Thereby, the ray can reach the opening 14 before being absorbed by the material(s) of the transparent electrode 11. Subsequently, the ray can enter in the luminous material layer 12 from the end of the transparent electrode 11. This ray is reflected by the reflecting electrode 13, and reaches the interface between the luminous material layer 12 in the opening 14 and the second insulating layer 29. It can get out without reflection at the interface.

On the other hand, when rays are emitted in the direction toward the reflecting electrode 13, the rays follow the same tracks as described above after the rays are reflected at the reflecting electrode 13. Namely, some rays are trapped, others can get out.

As described above, the rays emitted from the luminous material layer 12 propagate in the transparent electrode 11 as well as in the luminous material layer 12 by repeating total internal reflection until reaching the opening 14, though some rays are absorbed by these layers. Now, a horizontal distance should be considered. The horizontal distance is where the rays have to be propagated. When a square opening configuration is formed as shown in FIG. 4, the horizontal distance is approximately equal to the distance between adjacent openings.

On the other hand, when this opening configuration is not adopted, the horizontal distance can be as large as the diagonal distance of the transparent electrode 11. There is a big difference between the two configurations. The larger the opening size is, the more significant the difference between the configurations is. Namely, the horizontal distance depends on the size of the openings. When each opening is extremely large, light emitting areas accordingly gets smaller. In this case, luminous efficiency can be increased. However, practical luminous intensity cannot be obtained. Therefore, the optimal size and shape of the openings should be determined in consideration of the light loss caused by self-absorption in the materials involved and multiple reflection by one of the electrodes, as well as the light intensity required for instruments.

Here is an example in detail of the above-described configuration. For example, in a displaying device having a resolution of 200 dpi, the transparent electrode 11 is formed at 100 $\mu$m×110 $\mu$m and each of the openings 14 is formed at 4 $\mu$m×4 $\mu$m of square corresponding to an arrangement pitch 127 $\mu$m of each color pixel. The size of the opening 14 is determined according to a design rule based on precision of micro-fabrication for photolithography and etching to form these devices on a large sized substrate. In this case, the light emitted from the luminous material layer 12 can reach the opening 14 by propagating the horizontal distance approximately 4 $\mu$m×1.414=5.6 $\mu$m at the maximum. This distance is approximately 1/80 compared to the maximum horizontal distance 450 $\mu$m in the case of a no opening configuration. Consequently, it is possible to reduce the loss of light to a large extent, which is caused by self-absorption in the luminous material layer 12 and the transparent electrode 11, as well as by reflection loss by the reflecting electrode 13. Incidentally, the manufacturing method and the size in the present invention will not be limited to the above-described numeral values and the production method thereof. For example, the shape of the openings 14 may be a polygon shape (including a rectangular shape, etc.), circular shape (including a ellipsoid shape, etc.), and so forth.

Figure 11:
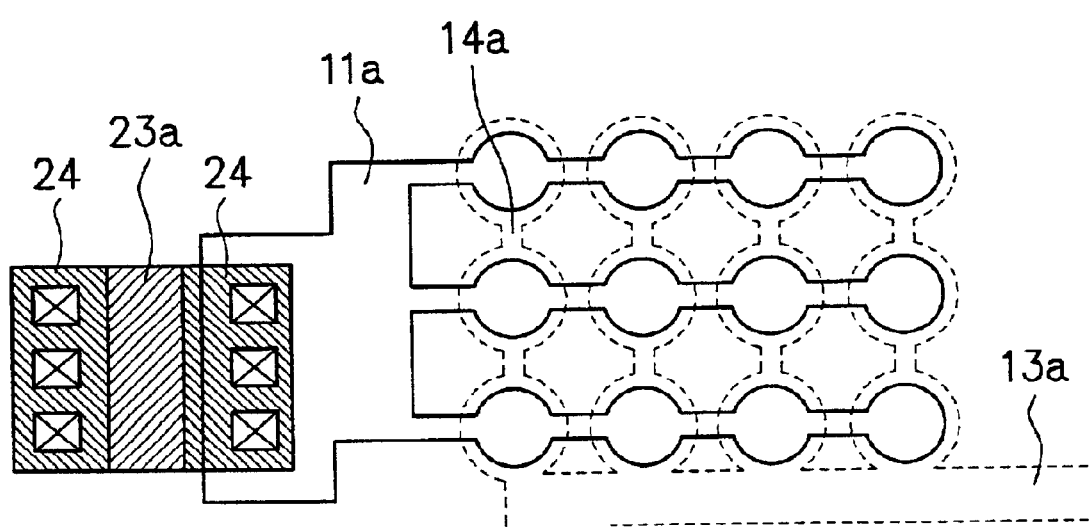
FIG. 11 is a diagram explaining a light emitting device according to a modified example of the first embodiment.

As described above, according to the first embodiment of the present invention, the openings 14 are made in the transparent electrode 11. Thereby, the distance where the rays have to be propagated in the luminous material(s) and the transparent electrode material(s) can be reduced. Therefore, the luminous efficiency can be increased. Here is an example of the first embodiment by using a modified transparent electrode as shown in FIG. 11, wherein the same effect as the first embodiment can be obtained. A transparent electrode 11a and a reflecting electrode 13a shown in FIG. 11 have a comb shape partly having circular regions, respectively. In FIG. 11, the same reference numerals denote the same parts as those in FIG. 4. In this modified example, a reflecting electrode 13a is placed so that the teeth-shaped part of the reflecting electrode 13a is orthogonal to that of the transparent electrode 11a. Thereby, the luminous areas are approximately circular. By the circular luminous regions, the horizontal distance from a light emitting point to an light exit 14a can be_reduced compared to the configuration shown in FIG. 4.

Incidentally, it is possible to substitute the component parts, and choose kinds, sizes, etc. of materials in this embodiment without departing from the scope and spirit of the present invention. It is also possible to add new functions by using new components.

The first embodiment employed a top-gate poly-Si TFT as an example. However, it is also possible to configure the circuit shown in FIG. 10 by using a bottom-gate poly-Si TFT. In order to realize a color display, there can be employed a configuration so as to emit three primary colors R, G and B (red, green and blue) as one pixel. The light emitting device having such pixel can also be realized by a combination of a color filter(s) and a white light emitting material(s), or a blue light emitting material(s) and a color-changing material(s), or a parallel arrangement of three-color luminous materials, etc. These configurations are also regarded as the first embodiment or the modified embodiment thereof.

FIG. 12 is a diagram explaining main components of a light emitting device according to a second embodiment of the present invention. In FIG. 12, the same reference numerals denote the same parts as those in the first embodiment. The second embodiment is the same as the first embodiment except that slope sections are formed in some regions of a second insulating layer 29b. The slope sections are formed by patterning the second insulating layer 29b. A transparent electrode 11b is formed at upper plateau regions of the convex sections of the second insulating layer 29b, whose ground plane is the same as that shown in FIG. 4. As with the first embodiment, a plurality of the slope section is formed in one pixel. The slope sections is oblique so that light propagated in the luminous material layer 12b and the transparent electrode 11b can be reflected at the reflecting electrode 13b after the light gets out of the transparent electrode 11b and the luminous material layer 12. Therefore, the light trapped in these materials can be taken out with high efficiency. Furthermore, by forming a plurality of the slope section in one pixel, as with the first embodiment, the horizontal distance in which the light trapped in these layers have to be propagated can be reduced. Thereby, more lights can be directed toward the transparent substrate 10. Consequently, the luminous efficiency can be increased. Further, the slope sections are formed simultaneously when the contact holes are made in the second insulating layer 29b. Thereby, there is no need to add extra processes.

Figure 13:
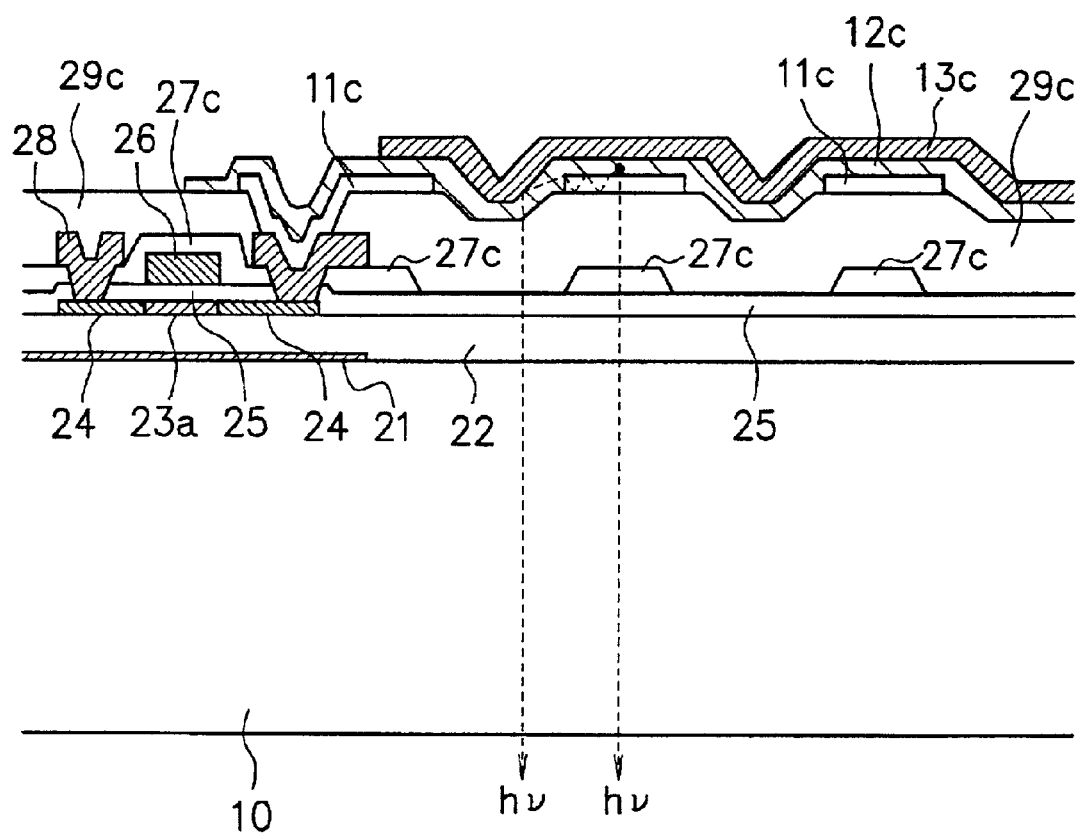
FIG. 13 is a diagram explaining a light emitting device according to a modified example of the second embodiment.
Figure 14:
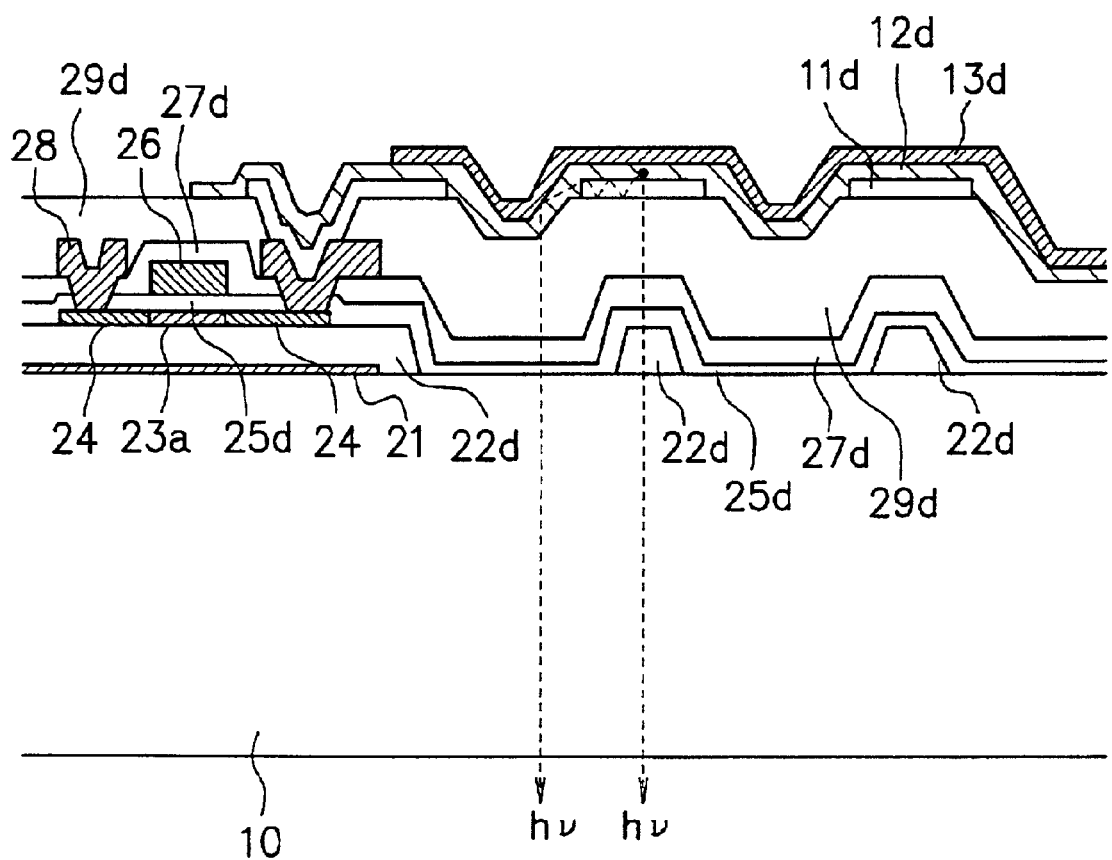
FIG. 14 is a diagram explaining a light emitting device according to another modified example of the second embodiment.

As described above, the slope sections are formed by utilizing the patterning process of the second insulating layer 29b. However, it is also possible to utilize another process in the TFT manufacturing processes. For example, as shown in FIG. 13, a first insulating layer 27c is patterned when contact holes are made to connect the source/drain electrode 28 to the source/drain areas 24. Simultaneously, the slope sections are formed. Furthermore, as shown in FIG. 14, the slope sections can be formed by patterning a barrier layer 22d.

Figure 15:
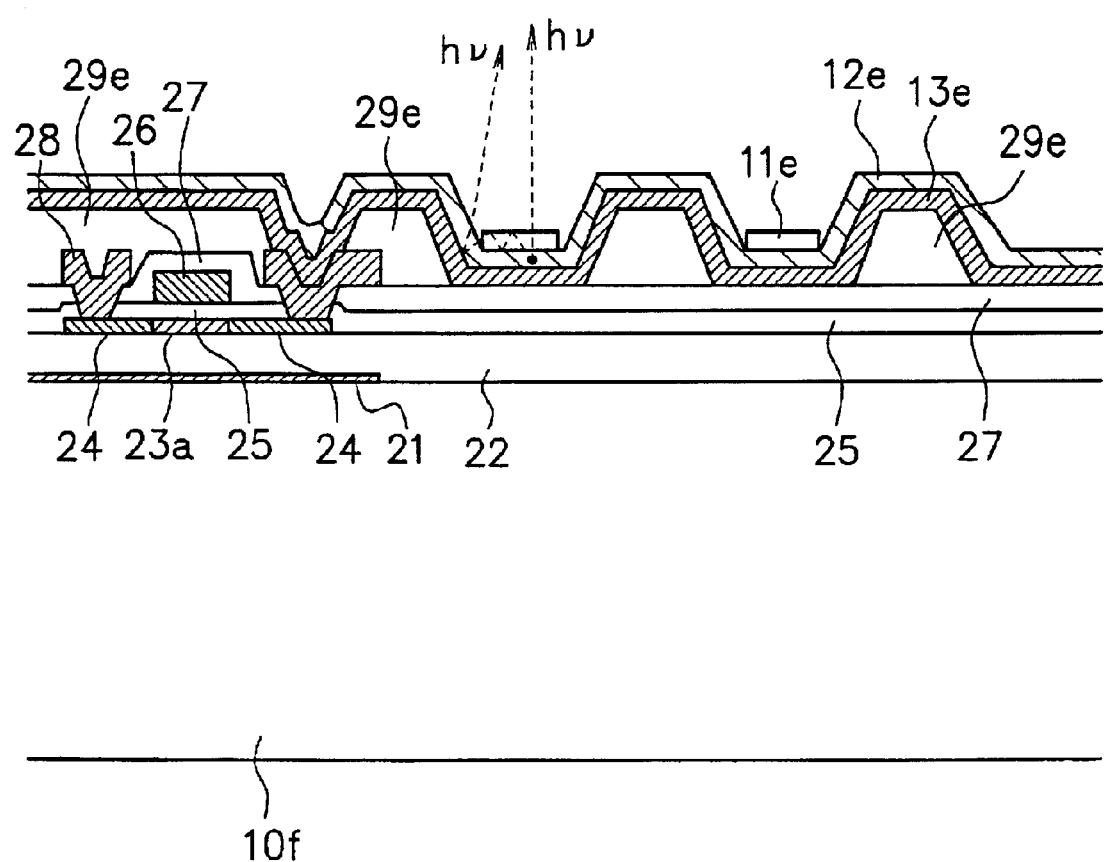
FIG. 15 is a diagram explaining main components of a light emitting device according to a third embodiment of the present invention.

Next will be an explanation of a third embodiment of the present invention. FIG. 15 is a diagram explaining main components of the light emitting device according to a third embodiment of the present invention. In this embodiment, the positions of the transparent electrode and the reflecting electrode are switched around compared to those in the first and second embodiments. By this configuration, lights are emitted upward. In this case, the substrate does not have to be transparent. The slope sections are formed when patterning a second insulating layer 29e. Then, a transparent electrode 11e is formed in the concave sections on a luminous material layer 12e. The operations in this embodiment are the same as those in the first and second embodiments except that rays are emitted in the opposite direction.

As described above, the substrate does not have to be transparent because rays are emitted upward. Thereby, a material for the substrate can be flexibly selected from various materials. For example, it is possible to form a light emitting device including TFT on a flexible plastic substrate such as polyimide, whose transparency is low but which can resist relatively high temperature up to approximately 200 to 300° C.

Furthermore, as shown in FIG. 15, it is also possible to set a reflecting electrode 13e, the luminous material layer 12e and the transparent electrode 11e on the regions occupied by the TFT and the wiring material(s) as well. Therefore, the area of the luminous section can be enlarged, and a bright light emitting device can be obtained.

Incidentally, as with the second embodiment, the slope sections may be formed by patterning the first insulating layer or the barrier layer. Therefore, such configurations can be regarded as the third embodiment.

Next will be an explanation of a fourth embodiment of the present invention. FIG. 16 is a diagram showing a configuration wherein inorganic materials may be used for the luminous section. A luminous material layer 12f is made of inorganic materials such as ZnS: Mn, ZnS: Tb, or CaS: Eu. A first insulating layer 15 and a second insulating layer 16 are made of materials such as SiNx, $SiO_2$, $Ta_2O_5$. The first insulating layer 15 and the second insulating layer 16 are formed on (top and under) surfaces of the luminous material layer 12f. Besides, as shown in FIG. 16, openings 14f are formed in a transparent electrode 11f and the first insulating layer 15. The other parts of the configuration and the operations are the same as those in the first embodiment of the present invention.

In this embodiment, the same effects as the above embodiments can be obtained. However, it is preferable to use organic EL materials compared to inorganic materials. This is because the processes of forming the first and second insulating layers are added in the latter case. Furthermore, alternating current at approximately 100 volts is needed to drive the inorganic materials. Thereby, it is preferable to use the organic materials that can be driven by direct current at less than or equal to 10 volts. The low voltage operation is important for applications for portable devices, such as cellular phones, etc.

As set forth hereinbefore, a plurality of opening is formed in a process of forming a TFT or a process of forming a luminous section in order to take out light emitted from a light emitting layer efficiently. Thereby, comparing to the conventional manufacturing processes, a layer forming process, a photolithography process, an etching process, etc. can be diminished. Therefore, it is possible to reduce manufacturing costs, and mass production becomes possible.

Further, by forming a plurality of opening in a transparent electrode, slope sections are formed in a luminous material layer and a reflecting electrode. Thereby, the distance from a light emitting point to the openings can be reduced. Furthermore, it is possible to reduce absorption by the transparent electrode and the luminous material layer, and losses of light when the light is reflected at a reflecting electrode. Therefore, it is possible to increase an amount of light that can be taken out. Consequently, it is possible to increase luminous efficiency of light emitting devices. This is advantageous for devices applied to instruments needing low power consumption such as PDAs, notebook computers, etc.

Further, the transparent electrode has the plural openings. The openings can be a polygon shape (for example, a square shape, a rectangular shape, etc.) or a circular shape (including an ellipsoid shape, etc.). Thereby, it is possible to reduce loss of light absorbed by the materials of the transparent electrode and the luminous material layer, and loss of light reflected by the reflecting electrode.

Furthermore, when a configuration in which light is emitted upward is employed, a substrate does not need to be transparent. Thereby, a material for the substrate can be flexibly selected from various materials. For example, it is possible to form a light emitting device including TFTs on a flexible plastic substrate such as polyimide, whose degree of transparency is low but which has high resistivity at relatively high temperature to approximately 200 to 300° C.

The present invention has been described with reference to the particular illustrative embodiments. However, it is not to be restricted by those embodiments but only by the appended claims. It is to be appreciated that those skilled in the art can change or modify the embodiments without departing from the scope and spirit of the present invention.

What is claimed is:

1. A light emitting device comprising:
   a thin film transistor (TFT) on an insulating base material; and above the TFT,
   a luminous section including a luminous material layer; and
   electrode layers supplying current to the luminous material layer, where one of the electrode layers is made of a transparent material in plane view having a comb shape partly having circular regions; and
   a plurality of openings intermittently spaced in one pixel in a predetermined pattern on one of the insulating base material and at least one material placed above the insulating base material and below the luminous material layer.

2. The light emitting device as claimed in claim 1, wherein the luminous material layer is made of organic materials.

3. A light emitting device comprising:
   stacked above an insulating base material,
   a first electrode layer to supply current to a luminous material layer, the luminous material layer emitting light by supplying current thereto, and
   a second electrode layer to supply current to the luminous material layer;
   either the first electrode layer or the second electrode layer being made of a transparent material in plane view having a comb shape partly having circular reasons; and
   a plurality of intermittently spaced openings in a predetermined pattern on either the first electrode layer or second electrode layer made of the transparent material, and concavities and convexities formed on the luminous material layer and on the other electrode layer.

4. The light emitting device as claimed in claim 3, wherein the luminous material layer is made of organic materials.

5. The light emitting device as claimed in claim 3, wherein:
   the luminous material layer is made of inorganic materials; further comprising
   a first insulating layer between the luminous material layer and the first electrode layer; and
   a second insulating layer between the luminous material layer and the second electrode layer.

6. A light emitting device comprising:
   a TFT on an insulating base material stacked above the insulating base material,
   at least a first electrode layer to supply current to a luminous material layer, the luminous material layer emitting light by supplying current thereto, and
   a second electrode layer to supply current to the luminous material layer;

either the first electrode layer or the second electrode layer being made of a transparent material; and either the first electrode layer or the second electrode layer made of the transparent material in plane view has a comb shape partly having circular regions, and the luminous material layer and the other electrode layer stacked on the electrode layer made of the transparent material are in the shape of concavities and convexities in side view.

7. The light emitting device as claimed in claim 6, wherein the luminous material layer is made of organic materials.

8. The light emitting device as claimed in claim 6, wherein:

the luminous material layer is made of inorganic materials; further comprising a first insulating layer between the luminous material layer and the first electrode layer; and a second insulating layer between the luminous material layer and the second electrode layer.

9. A light emitting device comprising:

a TFT on an insulating base material; and stacked above the insulating base material, at least an insulating layer, a first electrode layer to supply current to a luminous material layer, the luminous material layer emitting light by supplying current thereto, and a second electrode layer to supply current to the luminous material layer;

the first electrode layer being made of a transparent material in plane view having a comb shape partly having circular regions;

the second electrode layer being made of a reflecting material;

a plurality of openings intermittently spaced in one pixel on one of the insulating base material and at least one material placed above the insulating base material and below the luminous material layer; and the first electrode layer on convex sections of the insulating layer.

10. The light emitting device as claimed in claim 9, wherein the luminous material layer is made of organic materials.

11. The light emitting device as claimed in claim 9, wherein:

the luminous material layer is made of inorganic materials; further comprising a first insulating layer between the luminous material layer and the first electrode layer; and a second insulating layer between the luminous material layer and the second electrode layer.

12. A light emitting device comprising:

a TFT on an insulating base material; and stacked above the insulating base material, at least an insulating layer, a first electrode layer to supply current to a luminous material layer, the luminous material layer emitting light by supplying current thereto, and a second electrode layer to supply current to the luminous material layer;

the second electrode layer being made of a transparent material in plane view having a comb shape partly having circular regions;

the first electrode layer being made of a reflecting material;

a plurality of intermittently spaced openings in a predetermined pattern on at least one of the insulating base material and at least one material placed above the insulating base material and below the luminous material layer; and the second electrode layer is on concave sections of the luminous material layer.

13. The light emitting device as claimed in claim 12, wherein the luminous material layer is made of organic materials.

14. The light emitting device as claimed in claim 12, wherein:

the luminous material layer is made of inorganic materials; further comprising a first insulating layer between the luminous material layer and the first electrode layer; and a second insulating layer between the luminous material layer and the second electrode layer.

15. A production method of a light emitting device formed through a thin film transistor (TFT) fabrication process fabricating a TFT on an insulating base material and a luminous section fabrication process fabricating a luminous section including a luminous material layer and electrode layers supplying current to the luminous material layer above the TFT, comprising forming a first electrode layer to supply current to a luminous material layer on the insulating layer;

forming a second electrode layer to supply current to the luminous material layer on the luminous material layer, wherein:

the first electrode layer is made of a transparent material;

the second electrode layer is made of a reflecting material; and a process of developing a plurality of intermittently spaced openings in a predetermined pattern to at least one of the insulating base material and at least one material placed above the insulating base material and below the luminous material layer in the TFT fabrication process or the luminous section fabrication process.

16. A production method of a light emitting device comprising steps of:

forming a first electrode layer to supply current to a luminous material layer above an insulating base material;

forming the luminous material layer emitting light by supplying current thereto on the first electrode layer; and forming a second electrode layer to supply current to the luminous material layer on the luminous material layer, wherein:

at least one of the first electrode layer and the second electrode layer is made of a transparent material, the electrode layer made of the transparent material in plane view has a comb shape partly having circular regions; and a plurality of intermittently spaced openings are developed in a predetermined pattern to the electrode layer made of the transparent material, and concavities and convexities are formed to the luminous material layer and the other electrode layer owing to the plurality of openings.

17. A production method of a light emitting device comprising steps of;

forming a first electrode layer to supply current to a luminous material layer above an insulating base material;

forming the luminous material layer emitting light by supplying current thereto on the first electrode layer; and forming a second electrode layer to supply current to the luminous material layer on the luminous material layer, wherein:

at least one of the first electrode layer and the second electrode layer is made of a transparent material; and the electrode layer made of the transparent material in plane view has a comb shape partly having circular regions, and the luminous material layer and the other electrode layer stacked on the electrode layer made of the transparent material are formed in the shape of concavities and convexities in side view.

18. A production method of a light emitting device comprising steps of:

fabricating a TFT on an insulating base material;

forming an insulating layer above the insulating base material on which the TFT is fabricated;

forming a first electrode layer to supply current to a luminous material layer on the insulating layer;

forming the luminous material layer emitting light by supplying current thereto on the first electrode layer; and forming a second electrode layer to supply current to the luminous material layer on the luminous material layer, wherein:

the first electrode layer is made of a transparent material;

the second electrode layer is made of a reflecting material;

a plurality of intermittently spaced openings are formed to at least one of the insulating base material and at least one material placed above the insulating base material and below the luminous material layer in the TFT fabrication process or the insulating layer forming process; and the first electrode layer is formed on convex sections of the insulating layer formed owing to the plurality of openings.

19. A production method of a light emitting device comprising steps of:

fabricating a TFT on an insulating base material;

forming an insulating layer above the insulating base material on which the TFT is fabricated;

forming a first electrode layer to supply current to a luminous material layer on the insulating layer;

forming the luminous material layer emitting light by supplying current thereto on the first electrode layer; and forming a second electrode layer to supply current to the luminous material layer on the luminous material layer, wherein:

the second electrode layer is made of a transparent material;

the first electrode layer is made of a reflecting material;

a plurality of intermittently spaced openings are formed in a predetermined pattern to at least one of the insulating base material and at least one material placed above the insulating base material and below the luminous material layer in the TFT fabrication process or the insulating layer forming process; and the second electrode layer is formed on concave sections of the luminous material layer formed owing to the plurality of openings.

* * * * *